United States Patent
Vittorio

(10) Patent No.: US 7,352,181 B2
(45) Date of Patent: Apr. 1, 2008

(54) METHOD OF MAGNETIC RESONANCE IMAGING

(75) Inventor: Viti Vittorio, Arenzano (IT)

(73) Assignee: Esaote S.p.A., Milan (IT)

( * ) Notice: Subject to any disclaimer, the term of this patent is extended or adjusted under 35 U.S.C. 154(b) by 37 days.

(21) Appl. No.: 11/436,050

(22) Filed: May 18, 2006

(65) Prior Publication Data

US 2007/0090839 A1 Apr. 26, 2007

(30) Foreign Application Priority Data

Oct. 20, 2005 (EP) .................................. 05425737

(51) Int. Cl.
*G01V 3/00* (2006.01)
(52) U.S. Cl. ..................................... 324/309; 324/307
(58) Field of Classification Search ................ 324/309, 324/307; 600/410
See application file for complete search history.

(56) References Cited

U.S. PATENT DOCUMENTS

| 5,529,069 | A | * | 6/1996 | Andoh ........................ 600/410 |
| 6,556,009 | B2 | * | 4/2003 | Kellman et al. ............. 324/309 |
| 6,833,700 | B2 | * | 12/2004 | Lee et al. .................... 324/307 |
| 6,876,201 | B2 | * | 4/2005 | Takizawa et al. ........... 324/318 |

FOREIGN PATENT DOCUMENTS

WO 02/086528 A1 10/2002

OTHER PUBLICATIONS

M. Bydder et al., "Combination of Signals from Array Coils Using Image-Based Estimation of Coil Sensitivity Profiles", Magnetic Resonance in Medicine, Mar. 2002, pp. 539-548, vol. 47, No. 3, XP-002207883 (cited in International Search Report and specification).
Deniz Erdogmus et al., "Image Construction Methods for Phased Array Magnetic Resonance Imaging", Journal of Magnetic Resonance Imaging, Aug. 2004, pp. 306-314, vol. 20, No. 2, XP-002372465 (cited in International Search Report).
International Search Report dated Mar. 29, 2006.

\* cited by examiner

*Primary Examiner*—Louis M. Arana
(74) *Attorney, Agent, or Firm*—Buchanan Ingersoll & Rooney PC

(57) ABSTRACT

A method of magnetic resonance imaging includes exciting magnetic resonant active nuclei in a region of interest; creating magnetic field gradients; receiving radio frequency data from the region of interest; and producing an image by combining images obtained from radio frequency signals of single coils of the array and weighting the images of each coil with a sensitivity of the corresponding coil, wherein an estimated sensitivity of each coil of the array being used is determined by applying a smoothing filter to a k-space data set received from each coil; and wherein for a one-dimensional sensitivity profile the filter is configured with a triangular shape and for a two-dimensional sensitivity profile the filter is configured with a pyramidal shape, the triangular filter having a width and the pyramidal filter having a base double a maximum spatial frequency of the corresponding coil field.

11 Claims, 4 Drawing Sheets

Simulated image with fast transitions "added" to the coil map

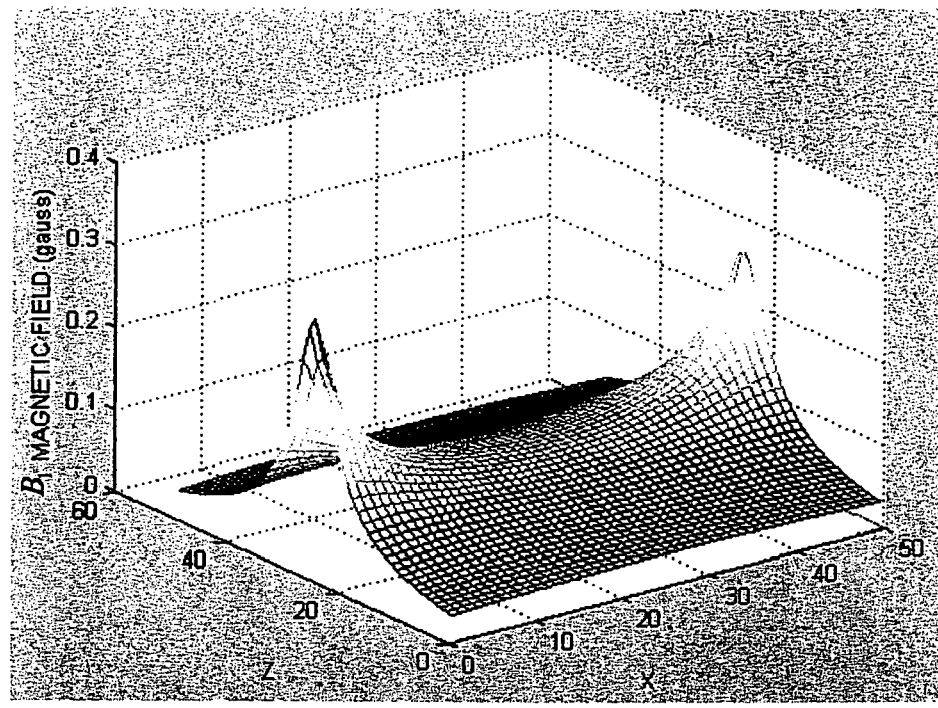
Fig. 1 magnetic field $B_1$ map of the loop coil in the xz plane orthogonal to the coil plane
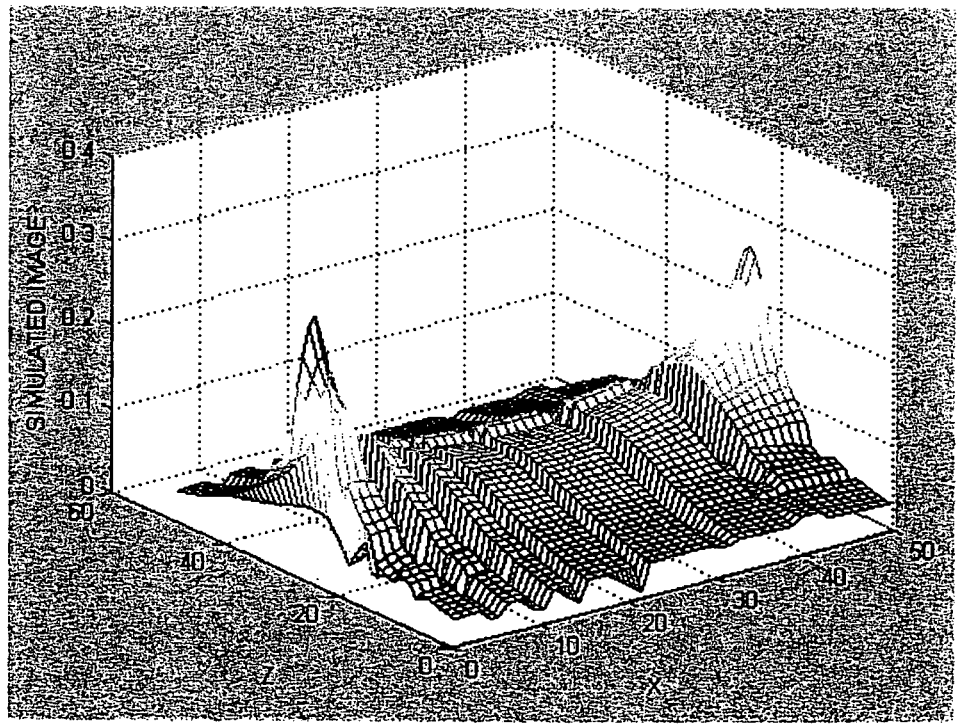
Fig. 2 Simulated image with fast transitions "added" to the coil map

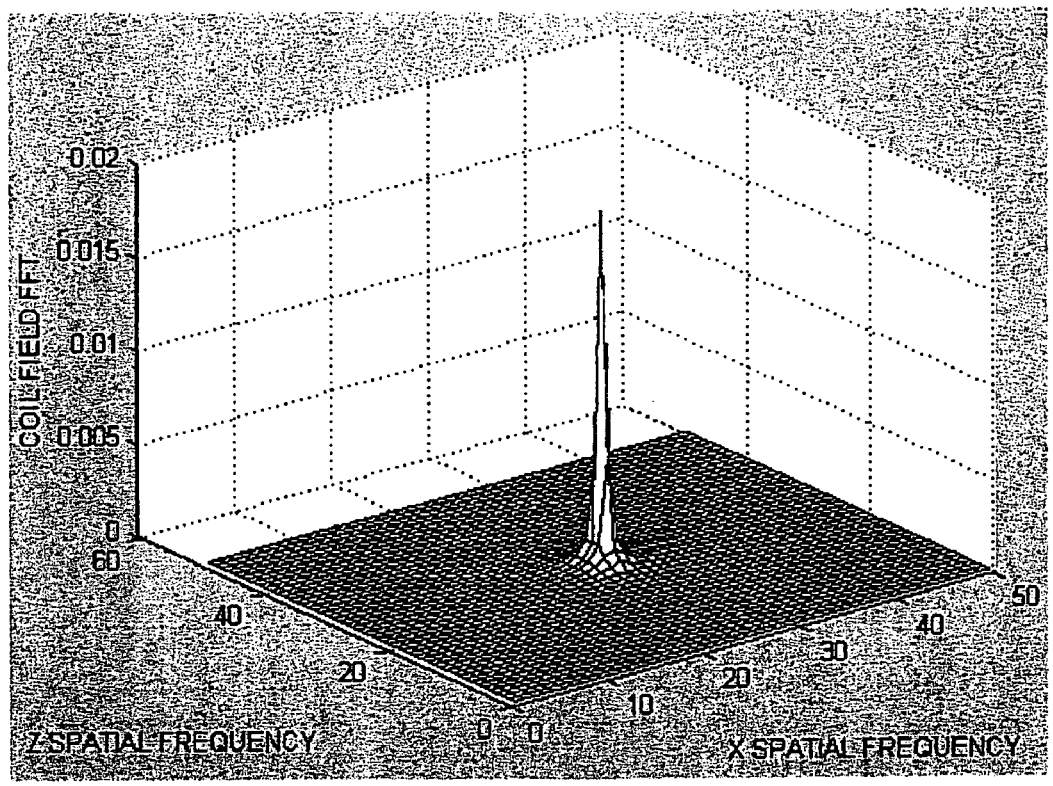
Fig. 3A Coil sensitivity inverse transform
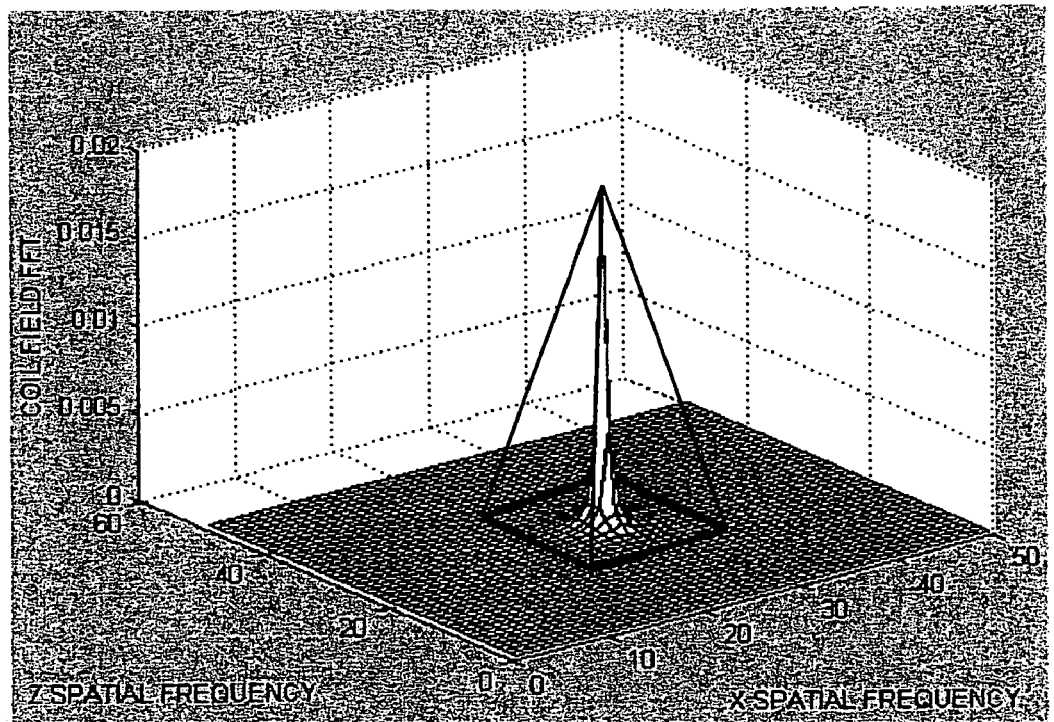
Fig. 3B Coil sensitivity inverse transform and piramidal filter

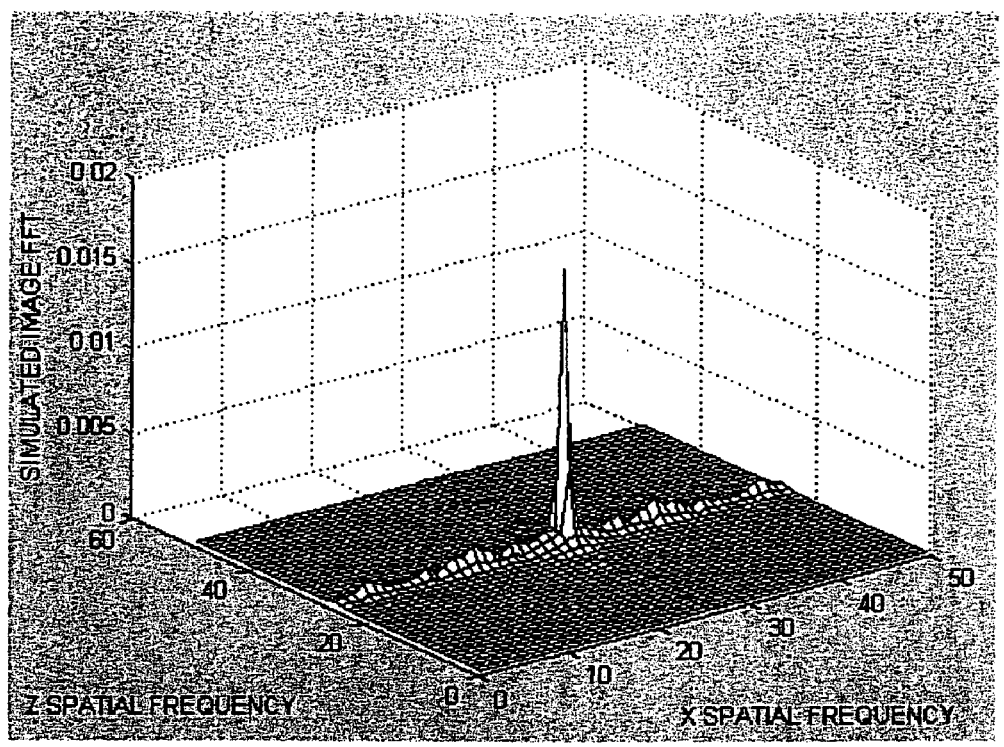
Fig. 4 Simulated image inverse transform
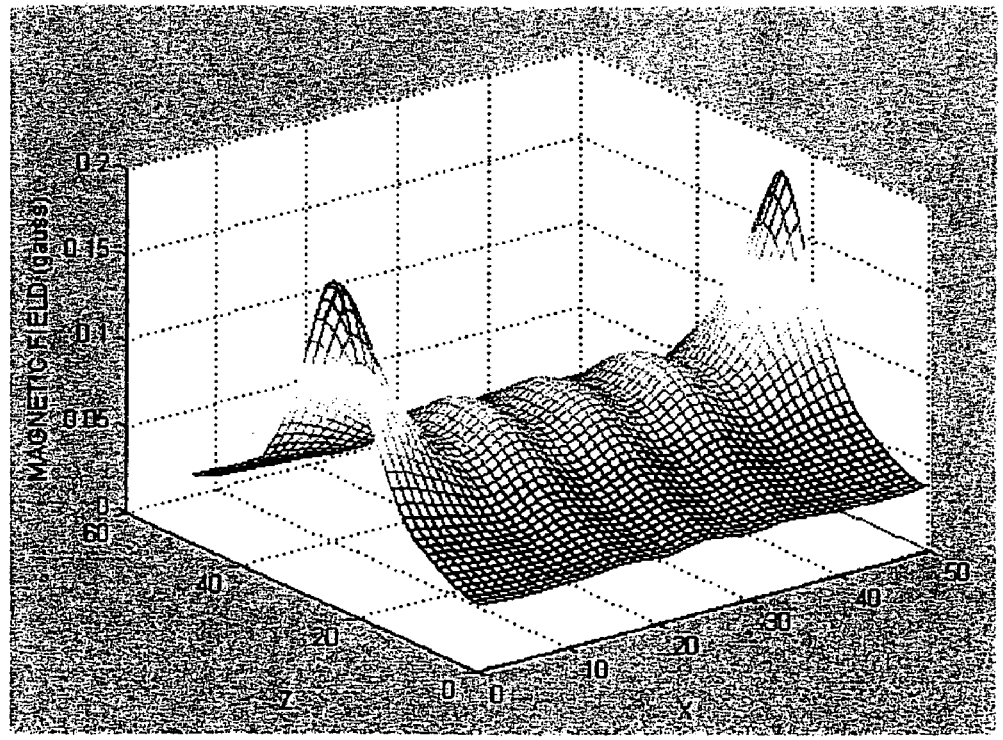
Fig. 5 Reconstructed field map

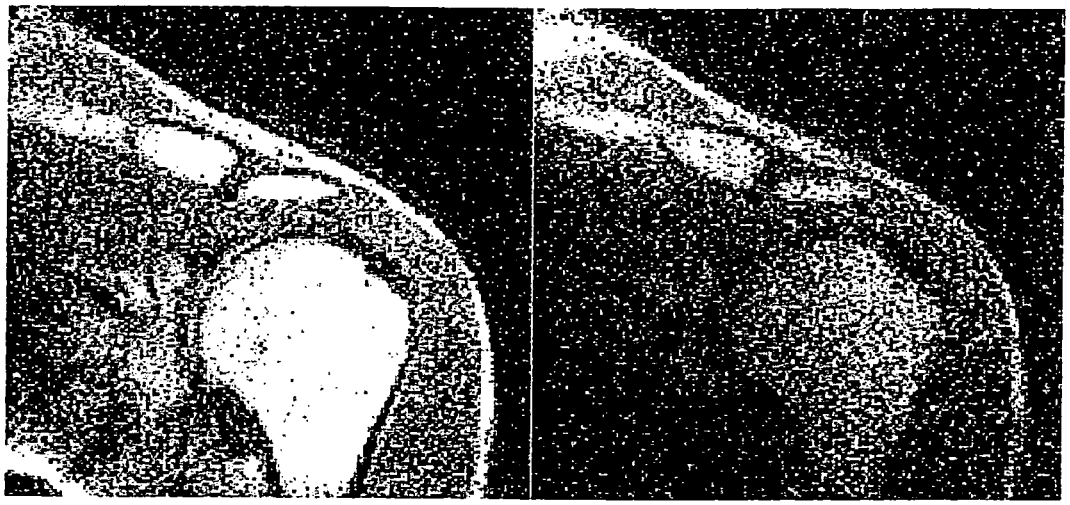
Coil 1  Coil 2
Fig. 6 Uncombined images
Fig. 7 SoS combination
Fig. 8 SUPER reconstruction with piramidal filter

METHOD OF MAGNETIC RESONANCE IMAGING

The invention relates to a method of magnetic resonance imaging comprising the steps of:

exciting magnetic resonant (MR) active nuclei in a region of interest;

creating magnetic field gradients in a phase-encode direction for spatially encoding the excited MR active nuclei;

the number of phase-encode gradients producing a field of view corresponding to the region of interest;

receiving radio frequency data from the region of interest using an array of at least two radio frequency receive coils, and producing from the radio frequency data an image by combining the images $S_i$ obtained from the radio frequency signals of the single coils $C_i$ of the array by weighting the said images $S_i$ of each coil $C_i$ with the sensitivity $B_i$ of the corresponding coil $C_i$;

an estimated sensitivity $B_i'$ of each coil $C_i$ of the array being used which is determined by applying a smoothing filter $F_i$ to the image $S_i$ of each coil $C_i$.

In particular the invention refers to an optimum filter design for phased array image reconstruction using the so called SUPER algorithm which is described in greater detail in "Combination of Signals From Array Coils Using Image-Based Estimation of Coil Sensitivity Profiles" M. Bydder, D. J. Larkman and J. V. Hajnal Magnetic Resonance in Medicine 47: pages 539-548, 2002 and in the corresponding application EP 1384088.

Phased array coils are used in magnetic resonance imaging (MRI) systems to obtain high SNR (signal to noise ratio) and a large region of sensitivity. The outputs from the receiver channels i.e. the coils of the array are combined in order to construct a single composite image from the data of many coils. For the image construction, usually sum-of-squares (SoS) method is used, which combines data without the knowledge of the coils sensitivity but it is known to provide low contrast images.

The use of phased array coils in Magnetic Resonance Imaging (MRI) was firstly fully described in 1990 by Roemer et al. in Roemer P B, Edelstein W A, Hayes C E, Souza S P, Mueller O M. The NMR Phased Array. Magn Reson Med 1990; 16:192-225, by confirming the ability of such multiple receiver coils systems to improve the imaging speed and the signal-to-noise ratio (SNR). A good summary of this technology is provided in Wright S M, Wald L L. Theory and Application of Array Coils in MR Spectroscopy. NMR in Biomedicine 1997; 10:394-410. The most commonly used method for image reconstruction is the so-called "sum-of-squares" (SoS) method, in which each pixel value of the reconstructed image is the square root of the sum of the squares of the pixel values corresponding to the individual coils in the array Larsson E G, Erdogmus D, Yan R, Principe J C, Fitzsimmons J R. SNR-Optimality of Sum-of-Squares Reconstruction for Phased-Array Magnetic Resonance Imaging. J Magn Reson 2003; 163:121-123. This method has the advantage that detailed RF (radio frequency) field maps of the coil do not have to be known but it is known to introduce signal bias in the estimated image, causing a decrease in image contrast, because the pixels are not weighted by the RF field produced by each coil. For increasing contrast, image data from arrays should be combined pixel by pixel with each coil's contribution weighted by its local sensitivity. In addition to SoS, a number of alternative techniques for image reconstruction with phased array coils have appeared. Debbins et al. Debbins J P, Felmlee J P, Riederer S J. Phase Alignment of Multiple Surface Coil Data for Reduced Bandwidth and Reconstruction Requirements. Magn Reson Med 1997; 38:1003-1011 proposed to sum the images coherently, after adjusting their relative phase. Walsh et al. (Walsh D O, Gmitro A F, Marcellin M W. Adaptive Reconstruction of Phased Array MR Imagery. Magn Reson Med 2000; 43:682-690) used adaptive filters to increase the SNR in the reconstructed image. In document "Combination of Signals From Array Coils Using Image-Based Estimation of Coils Sensitivity Profiles", Bydder M, Larkman D J, Hajnal J V. Magn Reson Med 2002; 47:539-548, it has been proposed a SUPER (Summation Using Profiles Estimated from Ratios) algorithm that estimates the coil sensitivities from the image, producing signal bias decreasing and a higher SNR respect to SoS method.

The image $S_i$ obtained from coil i in an array of N coils, neglecting the noise output from the coil, is given by:

$$S_i = B_i \cdot C \tag{1}$$

where C is the MR signal acquired from an ideal homogeneous coil and $B_i$ is the spatial sensitivity of coil i. Because the $B_i$'s generally vary slowly across the imaging volume, for the estimation of coil sensitivity Bydder et al. suggested to apply a smoothing filter $F_i$ to the $S_i$ image:

$$B_i' = S_i \hat{\times} F_i \tag{2}$$

where $\hat{\times}$ denotes convolution operation and $B_i'$ is the coil sensitivity estimate.

As it is clearly stated in document "Combination of Signals From Array Coils Using Image-Based Estimation of Coils Sensitivity Profiles", Bydder M, Larkman D J, Hajnal J V. Magn Reson Med 2002; 47:539-548, the critical point of the method resides in the definition of the smoothing filter $F_i$ necessary for estimating the coils sensitivity and despite some suggestions of the configuration of this filter no definitive and satisfactory filter design has been until now suggested.

The present invention has the object to provide for a optimum filter design for estimating the coils sensitivity in order to carry out the image reconstruction from the image contributions of single coils of a phased array of MRI receiving coils, thus rendering the MRI method using the said SUPER algorithm an effective tool for reconstructing nuclear magnetic resonance images in using phased array coils.

Relating to the above object it has to be observed that a non practical solution of the problem of determining the coils' sensitivities could consist in carrying out a coils' sensitivity measurement before each imaging session. In this case using an appropriate phantom the sensitivity of the coils could be determined precisely. Nevertheless this way to proceed is not comfortable and requires too much time. Furthermore considering that for each MRI session depending on the anatomical district to be imaged different coils have to be used and/or the coils position has to be changed within the magnetic structure of the MRI apparatus the above operation of determining the coil sensitivity by means of the phantom prior to the imaging session has to be repeated for each coil and/or for each coil position in the apparatus. Also in this case it has to be considered that non estimable effects on the coil field could be generated by the patient itself, so that in any case the imaging conditions could vary depending also from the influences due to the patient.

The present invention achieves the above mentioned aims with a method of magnetic resonance imaging comprising the steps of:

exciting magnetic resonant (MR) active nuclei in a region of interest;

creating magnetic field gradients in a phase-encode direction for spatially encoding the excited MR active nuclei;

the number of phase-encode gradients producing a field of view corresponding to the region of interest;

receiving radio frequency data from the region of interest using an array of at least two radio frequency receive coils, and producing from the radio frequency data an image by combining the images $S_i$ obtained from the radio frequency signals of the single coils $C_i$ of the array by weighting the said images $S_i$ of each coil $C_i$ with the sensitivity $B_i$ of the corresponding coil $C_i$;

an estimated sensitivity $B_i$ (Fourier domain) of each coil $C_i$ of the array being used, which is determined by applying a smoothing filter $f_i$ to the k-space data $s_i$ received from each coil $C_i$;

the said $f_i$ smoothing filter being estimated from the spatial frequencies content of the k-space sensitivity map of each coil, and the filter $f_i$ being a k-space filter with a triangular or pyramidal shape, depending on the fact that a single dimensional profile or a two dimensional image is reconstructed, the triangular filter having a width and the pyramidal filter having a base which is double than the maximum spatial frequency of the relative coil field.

The above definition will appear more clearly from the following formal theoretical explanation:

Reference is made to the previously defined equations (1) and (2). Because during an MR scan data is acquired in k-space, Equation (1) can be expressed in terms of k-space representation:

$$s_i(t) = b_i \otimes c = \int_{-\infty}^{+\infty} b_i(\tau) \cdot c(t-\tau) d\tau \qquad (3)$$

where the integral would be in 2-D or 3-D for, respectively, bi-dimensional or three-dimensional images, $s_i$ is the k-space representation of the data acquired, $b_i$ is the k-space representation of the coil spatial sensitivity and c is the k-space representation of the object (i.e., $$s_i = \mathcal{F}^{-1}\{S_i\}$$

where $\mathcal{F}^{-1}$ denotes Fourier inverse transform from the image domain to k-space).

Accordingly, the k-space representation of Equation (2) becomes:

$$b_i' = s_i \cdot f_i \qquad (4)$$

where $f_i$ is the Fourier inverse transform of the spatial filter $F_i$ and $b_i'$ is the Fourier inverse transform of estimated coil sensitivity $B_i'$.

Supposing that each coil does not have fast field variations in the image FOV and indicating with $sp_i$ the maximum spatial frequency of each coil field, it is possible to consider the following:

$$b_i(\tau) \approx 0 \text{ if } |\tau| \geq 0 \qquad (5)$$

Then, Eq. (3) becomes:

$$s_i(t) = \int_{-sp}^{+sp} b_i(\tau) \cdot c(t-\tau) d\tau \qquad (6)$$

Note that $s_i$ is a good estimate of $b_i$ if c is a highly homogeneous sample.

In a real imaging experiment, c is not homogeneous, so let's define the function $g = c \cdot f_i'$, with $f_i' = 0$ if $|t| \geq sp_i$ and $f_i' = 1$ if $|t| < sp_i$. The filter $f_i'$ transforms the sample into a highly homogeneous one without significantly distorting the sensitivity profiles of each coil. We now assume:

$$b_i'(t) = \int_{-\infty}^{+\infty} b_i(\tau) \cdot g(t-\tau) d\tau \qquad (7)$$
$$= \int_{-\infty}^{+\infty} b_i(t-\tau) \cdot c(\tau) \cdot f_i'(\tau) d\tau$$
$$= \int_{-sp}^{+sp} b_i(t-\tau) \cdot c(\tau) d\tau$$

After a variable changing with $z = t - \tau$, we obtain:

$$b_i'(t) = \int_{t-sp}^{t+sp} b_i(z) \cdot c(t-z) dz \qquad (8)$$

We now compare Eq. (8) with Eq. (6), obtaining:

for $$t \approx 0 \Rightarrow b_i'(t) \approx s_i(t) \qquad (9)$$

for $$|t| \geq 2spi \Rightarrow b_i'(t) \to 0$$

Observing this results, $b_i'$ of Eq. (4) is a good estimate of the coils sensitivity maps $b_i$ if the filter $f_i$ has a triangular form so that:

$$-f_i(0) = 1$$

$$-f_i(t) = 0 \text{ if } |t| \geq 2sp_i \qquad (10)$$

This means that the triangular filter to be applied to the acquired signals is the double in width of the rectangular filter $f_i'$ inside the integral of Equation 7.

After applying the filter to uncombined k-space data and estimating the coils sensitivities $B_i'$, we can perform the SUPER reconstruction [6]:

$$S_{SUPER} = \sqrt{\sum_i B_i'^2} \, |P_{opt}| \qquad (11)$$

where:

$$P_{opt} = \frac{1}{\sum_i B_i'^2} \sum_i S_i B_i' \qquad (12)$$

Substituting Eq. 12 in Eq. 11, the optimal reconstruction for a 2-element phased array coil is given by:

$$S_{SUPER} = \frac{S_1 B_1' + S_2 B_2'}{\sqrt{B_1'^2 + B_2'^2}} \quad (13)$$

where $S_1$ and $S_2$ are the images from coil 1 and coil 2, and $B_1'$ and $B_2'$ are the Fourier transforms of the estimated k-space sensitivities $b_i$ of coil 1 and 2, according to Eq. 4.

It has to be noted that the above formal explanation has been carried out by considering only one dimension. In this case the k-space filter design is that of a triangular filter. When considering a two dimensional case, which is the most common one in diagnostic MRI imaging then the filter has a pyramidal configuration (with square or rectangular base) since the same reasoning has to be applied for both direction of the two dimensional space.

A three dimensional image is normally formed by several slices, i.e. several two dimensional images which are acquired along adjacent section planes of the imaged object. For each slice, a k-space pyramidal filter apply correspondingly to the above mentioned two dimensional case.

As it appears clearly from the above, the k-space filter $f_i$ is applied to each of the uncombined raw data set $s_i$ of each coil $C_i$, giving the inverse transform of the estimated spatial sensitivity $B_i'$.

The coils images are then combined together in such a way that each image $S_i$ of each coil $C_i$ is weighted by the relative estimated sensitivity $B_i'$ of each coil $C_i$.

The images $S_i$ of each coil $C_i$ are combined together by adding the said images $S_i$ weighted by the estimates coil sensitivity $B_i'$ of the corresponding coil $C_i$ divided by the square root of the sum of the squares of the estimated sensitivities $B_i'$ of each coil $C_i$ of the array.

Starting from the fact that the estimation of the coil sensitivity can be obtained by multiplying each k-space data set received from each coil with a smoothing filter $f_i$ designed as defined above as a k-space triangular filter along one dimension or a k-space pyramidal filter along two dimensions, it is possible to determine the filter design criterion considering only few parameters as it appears evident from the following:

If M×N is the image dimension in the Fourier domain with a FOV (field of view) of Fm×Fn, the image resolution along M dimension and N dimension can be defined as, respectively:

$Rsm = \frac{Fm}{M}$ image resolution along $M$ direction $Rsn = \frac{Fn}{N}$ $N$ image resolution along $N$ direction Working in the k-space representation, as it is the case, if the native signal data matrix has m×n dimensions, and the filter has dimensions fa×fb, where fa and fb are determined according to Eq. (10) for each coil and direction, image resolutions will be:

$$Rsm = \frac{Fm}{m} \quad (15)$$

$$Rsn = \frac{Fn}{n}$$

and filter resolutions will be:

$$Rfa = \frac{m \cdot Rsm}{fa} \quad (16)$$

$$Rfb = \frac{n \cdot Rsm}{fb}$$

Keeping filter resolutions constant in Equation (16), if the image resolution is varied, finally it is obtained:

$$a = \frac{m \cdot Rsm}{Rfa} \quad (17)$$

$$b = \frac{n \cdot Rsn}{Rfb}$$

Thus considering the data of image resolution, field of view dimensions and filter resolution, the dimensions of the filter a and b in the k-space domain can be determined and thus the width of the triangular or pyramidal filter.

According to the above, the invention provides for a filter design method for generating the filter for estimating the coil sensitivity for each coil of an array of MRI receiving coils in which the width of the base of the triangular or pyramidal filter is determined along the one or two dimensions of the base of the said filter respectively as a function of the dimension of the image pixel matrix, of the image resolution and of the filter resolution along the said direction.

In the above function filter resolution is predefined according to Eq. (10) and (16), and considered a constant.

The above function provides for the determination of the filter width along one dimension of the filter and of the image by considering the said filter width as being directly proportional to the product of image width and image resolution along the said direction and inverse proportional to the filter resolution.

Furthermore filter resolution for each coil is determined along each direction by the equation:

$$Rfd_{x,z} = \frac{id_{x,z} \cdot Rid_{x,z}}{f_{x,z}}$$

where $Rfd_{x,z}$ is the filter resolution respectively in x or z direction;

$id_{x,z}$ is the image dimension in respectively x and z direction;

$Rid_{x,z}$ is the corresponding image resolution respectively in x or z direction.

$f_{x,z}$ is relative to the maximum spatial frequency content of each coil and is determined according to Eq. (10)

Furthermore optimum filter width for each coil is determined along each direction by the equation:

$$fd_{x,z} = \frac{id_{x,z} \cdot Rid_{x,z}}{Rfd_{x,z}}$$

where
$fd_{x,z}$ is the dimension of the filter respectively in x or z direction;

The features of the method according to the present invention and their advantages will appear more clearly from the following experiments and proves described by help of the enclosed drawings, wherein:

FIG. 1 illustrates the $B_1$ field map (relative to Coil 1 in FIG. 6) of the loop coil in the xz plane orthogonal to the coil plane and in the Fourier domain.

FIG. 2 illustrates the simulated MRI image signal obtained by means of fast transitions "added" to the coil $B_1$ field map.

FIG. 3A illustrates the coil sensitivity inverse transform, i.e. in the k-space or domain.

FIG. 3B illustrates the diagram of FIG. 3A with the pyramidal filter, tailored to the coil.

FIG. 4 illustrates the simulated image inverse transform.

FIG. 5 illustrates the reconstructed $B_1$ field map.

FIG. 6 illustrates the uncombined images of coil 1 and coil 2 of the array.

FIG. 7 illustrates the combination of the two images of coils 1 and 2 according to SoS (Sum of Squares) method.

FIG. 8 illustrates the combination of the two images of coils 1 and 2 according to SUPER method with the use of a piramidal filter for estimating the coils sensitivity.

COMPUTER SIMULATIONS

FIGS. 1 to 5 illustrates the results of a computer simulation carried out for testing the method according to the present invention.

Magnetic field pattern simulation of a 8 cm radius surface coil in a plane (xz) perpendicular to the plane of the coil (xy) is shown in FIG. 1, representing a FOV of 130×130 mm with 50×50 pixels dimensions data matrix. The figure shows the familiar high $B_1$ field intensity in the regions close to wires and a rapid intensity falloff along the axial z-direction.

For the simulation of a MR image acquired using this loop coil, according to Equation 1 some fast transitions has been added to the coil magnetic field pattern (B) for simulating an object to be imaged (C), obtaining the simulated image S, as shown in FIG. 2.

Applying the Fourier inverse transform to the coil sensitivity and to the simulated image matrices we found the k-space representations b and s, as shown in FIG. 3 and FIG. 4.

In order to determine the width of the filter $f$, we evaluated the extension of the coil spatial frequencies sp in FIG. 3A. Such spatial frequencies are negligible beyond the forth sample from the centre of the diagram, suggesting a total filter width of 16 samples in both x and z directions.

The squared base of the filter arises from the circular symmetry of the employed coils. According to the previous theory, we applied a 16 sample base piramidal filter ($fa=fb=16$) to the Fourier inverse transform of the simulated image S (see Eq. 4). Using Fourier transform for returning back in the image domain, we found a good estimation of the coil sensitivity map B', as shown in FIG. 5. Thus, the application of the designed filter permitted to extract the coil sensitivity map from the simulated image without significantly distorting the sensitivity profiles.

FIG. 3B, is a mere schematic attempt to illustrate the filter structure. Here the pyramidal filter having base dimensions 16×16 sample is designed on the graphical representation of the inverse coils sensitivity of FIG. 3A.

Now, using Eq. 15, we calculate the resolution of the simulated image (Fm=Fn=130, m=n=50), giving:

$$Rsm = \frac{Fm}{m} = \frac{130}{50} = 2.6 \qquad (18)$$

$$Rsn = \frac{Fn}{n} = \frac{130}{50} = 2.6$$

and filter resolutions, with the width of fa=fb=16, will be (see Eq. 16):

$$Rfa = \frac{m \cdot Rsm}{fa} = \frac{50 \cdot 2.6}{16} = 8.1 \qquad (19)$$

$$Rfb = \frac{n \cdot Rsn}{fb} = \frac{50 \cdot 2.6}{16} = 8.1$$

In order to verify the previous theory using real MR images, an optimal filter has been designed by keeping filter resolutions constant and applying it to images with 130×130 mm FOV and 160×160 pixels matrix dimensions. For this example (image of coil 1 in FIG. 6), the calculation of the image resolution provides:

$$Rsm' = \frac{Fm'}{m'} = \frac{130}{160} = 0.8 \qquad (20)$$

$$Rsn' = \frac{Fn'}{n'} = \frac{130}{160} = 0.8$$

Using Eq. 17, we obtained:

$$a = \frac{m' \cdot Rsm'}{Rfa} = \frac{160 \cdot 0.8}{8.1} = 16 \qquad (21)$$

$$b = \frac{n' \cdot Rsn'}{Rfb} = \frac{160 \cdot 0.8}{8.1} = 16$$

a and b are the piramidal filter base dimensions in the K-space domain and they are equal to the values obtained with the simulated images because MR images has been used with the same FOV (field of view) of the simulated case. Obviously, different values of the filter dimensions can be obtained using images with different FOV (field of views).

Image Reconstruction

FIGS. 6 to 8 illustrates the results of the image reconstruction by combining the images of each of two coils 1 and 2 of a phased coil array according to the Sum of Squares method and according to the Super method for which the coils sensitivity has been estimated by means of a pyramidal filter according to the method of the present invention.

Experimental results are shown in the following figures.

FIG. 6 shows uncombined images of the coils 1 and 2 obtained using the two coils with added Gaussian noise, in order to emphasize the bias effect from SoS (Sum of Squares) algorithm.

FIG. 7 shows the image resulting form the reconstruction by means of a conventional SOS combination and FIG. 8 shows the image resulting from the reconstruction by means of the SUPER algorithm in which the coils sensitivity has been estimated using the piramidal filter according to the present invention.

Comparing SoS and SUPER reconstruction with piramidal filter images it is worth to note that this latter has much improved contrast, with a darker background. To give a measure of the benefit of performing SUPER combination method with pyramidal filter design in respect to a conventional SoS combination, the difference has been calculated between the means of the pixel intensities calculated in a region-of-interest outside the object being imaged, providing both an estimate of the background noise decrease and image contrast increase. The result is a good 10% gain in using this SUPER combination method with pyramidal filter according to the present invention instead SoS reconstruction.

As it appears clearly form the above description, the invention provides for an efficient algorithm for the combination of image data from array coils, where each signal is weighted by the coils sensitivities. Using a piramidal filter as an optimised filter design for the coils sensitivity estimation by applying the said filter to the images of each coil, the RF coils maps has been estimated with good accuracy before applying SUPER reconstruction algorithm. This has provided for obtaining contrast image increase respect to the application of conventional methods like SoS (Sum of Squares).

The invention claimed is:

1. Method of magnetic resonance imaging comprising the steps of:
   exciting magnetic resonant (MR) active nuclei in a region of interest;
   creating magnetic field gradients in a phase-encode direction for spatially encoding the excited MR active nuclei to produce a field of view corresponding to the region of interest;
   receiving radio frequency data from the region of interest using an array of at least two radio frequency receive coils; and
   producing from the radio frequency data an image by combining images $S_i$ obtained from radio frequency signals of single coils $C_i$ of the array and weighting the images $S_i$ of each coil $C_i$ with a sensitivity $B_i$ of the corresponding coil $C_i$, wherein an estimated sensitivity $B'_i$ (Fourier domain) of each coil $C_i$ of the array being used is determined by applying a smoothing filter $f_i$ to a k-space data set $s_i$ received from each coil $C_i$;
   wherein the $f_i$ smoothing filter is estimated from spatial frequency content of a k-space sensitivity profile of each coil, and
   wherein for a one-dimensional sensitivity profile the filter $f_i$ is configured as a k-space filter with a triangular shape and for a two-dimensional sensitivity profile the filter $f_i$ is configured as a k-space filter with a pyramidal shape, the triangular filter having a width and the pyramidal filter having a base double a maximum spatial frequency of the corresponding coil field.

2. Method according to claim 1, wherein for each dimension the filter $f_i$ has a triangular form and is defined by the following function:

$-f_i(0)=1$ $-f_i(t)=0$ if $|t| \geq 2sp_i$ where t is a time variable and $sp_i$ the maximum spatial frequency of the i-th coil field.

3. Method according to claim 1, wherein the k-space filter $f_i$ is applied to each uncombined data set $s_i$ of each coil $C_i$ to produce an inverse transform of the estimated spatial sensitivity $B'_i$.

4. Method according to claim 1, wherein the coil signals are combined such that each image $S_i$ of each coil $C_i$ is weighted by the relative estimated sensitivity $B'_i$ of each coil $C_i$, the estimated sensitivity $B'_i$ of each coil $C_i$ being determined by multiplying each k-space data set received from each coil with the smoothing filter $f_i$ configured as the k-space triangular filter along one dimension when the sensitivity profile is one-dimensional and configured as the k-space pyramidal filter along two dimensions when the sensitivity profile is two-dimensional.

5. Method according to claim 1, wherein the images $S_i$ of each coil $C_i$ are combined together by adding the images $S_i$ weighted by the estimated coil sensitivity $B'_i$ of the corresponding coil $C_i$ divided by a square root of a sum of squares of the estimated sensitivities $B'_i$ of each coil $C_i$ of the array.

6. Method according to claim 1, wherein an optimal filter design is determined by calculating the width of the base of the triangular filter along the one dimension of the base when the spatial profile is one-dimensional and the width of the base of the pyramidal filter along the two dimensions of the base when the spatial profile is two-dimensional as a function of a dimension of an image pixel matrix, an image resolution and a filter resolution along the direction.

7. Method according to claim 6, wherein the filter resolution is a predefined constant.

8. Method according to claim 7, wherein the filter resolution is determined according to the function $-f_i(0)=1$ $-f_i(t)=0$ if $|t| \geq 2sp_i$ where $f_i$ is the k-space filter for each coil $C_i$ and has a triangular form for one-dimensional data and a pyramidal form for two-dimensional data and $sp_i$ is the maximum spatial frequency of the i-th coil field so that $$Rfa = \frac{m \cdot Rsm}{fa}$$

where m is the dimension of a native signal data matrix having dimension m×n; fa is the filter dimension along the same direction of a filter having dimensions fa×fb, and Rsm is given by $$Rsm = \frac{Fm}{m}$$

Fm being one dimension of a field of view having dimensions Fm×fn and m being the corresponding dimension of the native signal data matrix having dimensions m×n.

9. Method according to claim 6 wherein the filter width along one dimension of the filter and of the image is determined by considering the filter width as being directly proportional to a product of image width and image resolution along the direction and inversely proportional to the filter resolution.

10. Method according to claim 9, wherein the filter width for each coil is determined along each direction by the equation:

$$fd_{x,z} = \frac{id_{x,z} \cdot Rid_{x,z}}{Rfd_{x,z}}$$

where $fd_{x,z}$ is the dimension of the filter respectively in x or z direction;
$Rfd_{x,z}$ is the corresponding filter resolution respectively in x or z direction;
$id_{x,z}$ is the image dimension in respective x and z directions;
$Rid_{x,z}$ is the corresponding image resolution respectively in x or z direction.

11. Method according to claim 1, wherein image reconstruction from the combination of the images of a certain number I of coils of an array of coils $C_i$ is determined by the following equation:

$$S = \frac{\sum_i S_i \cdot (S_i \otimes f_i)}{\sum_i (S_i \otimes f_i)^2}$$

where
$S_i$ is the image of each coil $C_i$ of the array;
$f_i$ is the triangular or pyramidal filter;
$S$ is the reconstructed image obtained by combination of the images $S_i$ of each coil $C_i$ of the array;
$S_i \hat{\times} f_i$ is the estimated coil sensitivity of each coil $C_i$ of the array.

\* \* \* \* \*